United States Patent
Jiang et al.

(10) Patent No.: US 10,209,632 B2
(45) Date of Patent: Feb. 19, 2019

(54) PROXIMITY EXPOSURE DEVICE AND EXPOSURE METHOD THEREOF

(71) Applicants: BOE TECHNOLOGY GROUP CO., LTD., Beijing (CN); Hefei BOE Optoelectronics Technology Co., Ltd., Hefei, Anhui (CN)

(72) Inventors: Shengchao Jiang, Beijing (CN); Shirong Yu, Beijing (CN); Qingyong Meng, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/789,764

(22) Filed: Oct. 20, 2017

(65) Prior Publication Data

US 2018/0275522 A1 Sep. 27, 2018

(30) Foreign Application Priority Data

Mar. 23, 2017 (CN) .......................... 2017 1 0187193

(51) Int. Cl.
*G03F 7/20* (2006.01)

(52) U.S. Cl.
CPC ........ *G03F 7/70783* (2013.01); *G03F 7/7035* (2013.01)

(58) Field of Classification Search
CPC .......................... G03F 7/7035; G03F 7/70783
See application file for complete search history.

(56) References Cited

FOREIGN PATENT DOCUMENTS

| CN | 102955373 A | 3/2013 |
|---|---|---|
| CN | 104020643 A | 9/2014 |
| CN | 104635427 A | 5/2015 |
| JP | H04165354 A | 6/1992 |
| JP | H0882919 A | 3/1996 |
| JP | 2006093604 A | 4/2006 |
| JP | 2009277900 A | 11/2009 |

OTHER PUBLICATIONS

First Chinese Office Action, for Chinese Patent Application No. 201710187193.X, dated Dec. 5, 2017, 14 pages.
Second Chinese Office Action, for Chinese Patent Application No. 201710187193.X, dated Aug. 1, 2018.

*Primary Examiner* — Michelle M Iacoletti
(74) *Attorney, Agent, or Firm* — Kinney & Lange, P.A.

(57) ABSTRACT

The embodiments of the disclosure relate to a proximity exposure device and an exposure method thereof. The proximity exposure device includes: a loading table; a holder mounted onto the loading table to hold a mask; a vacuum hood arranged above the mask to form a sealed space above the mask; and a pumping mechanism connected to the vacuum hood to pump air from the vacuum hood such that a negative pressure state is formed above the mask.

12 Claims, 6 Drawing Sheets

PROXIMITY EXPOSURE DEVICE AND EXPOSURE METHOD THEREOF

CROSS-REFERENCE TO RELATED APPLICATION

This application claims the benefit of Chinese Patent Application 201710187193.X filed on Mar. 23, 2017 in the State Intellectual Property Office of China, the whole disclosure of which is incorporated herein by reference.

BACKGROUND

Technical Field

The embodiments of the present disclosure relate to the field of exposure technology, specifically to a proximity exposure device and an exposure method thereof, which for example, are applied in manufacture of display devices, microelectronic devices, semiconductor devices and the like.

Description of the Related Art

A proximity exposure machine is a type of exposure machine commonly used in lithography processes. Compared with a projection exposure machine, the proximity exposure machine has advantages such as a low cost, a high activation rate, photolithography effect of which may meet most of needs, thus it is most widely used in the modern photolithography technology.

In the proximity exposure machine, a mask is arranged to be opposite to a glass substrate which is coated with photoresist to be exposed, with a small gap therebetween. The gap is of a size, for example, 100 μm-400 μm, which may effectively avoid damage to the mask and the substrate to be exposed due to a direct contact between the mask and the substrate to be exposed. At the time of exposure, the exposure light is projected onto the substrate to be exposed through the mask to copy a pattern of the mask to the substrate.

In the proximity exposure machine, the exposure gap between the mask and the glass substrate directly affects the size of the pattern copied onto the substrate and the exposure accuracy. Therefore, the uniformity of the exposure gap directly affects the quality of the product.

SUMMARY

According to an aspect of the present disclosure, there is provided a proximity exposure device comprising a loading table; a holder mounted onto the loading table to hold a mask; a vacuum hood arranged above the mask to form a sealed space above the mask; and a pumping mechanism connected to the vacuum hood to pump air from the vacuum hood, such that a negative pressure state is formed above the mask.

According to an exemplary embodiment of the present disclosure, the vacuum hood further comprises at least one air introduction hole for introducing outside air into the vacuum hood.

According to an exemplary embodiment of the present disclosure, the air introduction hole is provided with a regulating valve configured to adjust the flow rate of the outside air flowing through the air introduction hole.

According to an exemplary embodiment of the present disclosure, the vacuum hood is fixed on the loading table.

According to an exemplary embodiment of the present disclosure, a sealing structure is provided below the loading table for forming a sealed state between the loading table and the mask.

According to an exemplary embodiment of the present disclosure, the proximity exposure device further comprises a drive mechanism for driving the holder to move up and down.

According to an exemplary embodiment of the present disclosure, the drive mechanism is a hydraulic drive mechanism, comprising a piston rod connected to the holder to drive the holder to move up and down; a cylinder block for accommodating the piston rod and hydraulic oil; and an electro-hydraulic servo valve connected to the cylinder block through a first hydraulic oil pipe and a second hydraulic oil pipe so as to control the piston rod to move up and down by controlling the hydraulic oil to flow into and out of the cylinder block through the first hydraulic oil pipe and the second hydraulic oil pipe.

According to an exemplary embodiment of the present disclosure, the proximity exposure device further comprises a control unit for controlling a pumping operation of the pumping mechanism.

According to an exemplary embodiment of the present disclosure, the proximity exposure device further comprises a control unit for controlling an operation of the drive mechanism.

According to an exemplary embodiment of the present disclosure, the proximity exposure device further comprises a control unit for controlling opening of the regulating valve.

According to an exemplary embodiment of the present disclosure, the proximity exposure device further comprises a negative pressure measuring device for measuring the magnitude of the negative pressure in the vacuum hood and transmitting a measurement result to the control unit; and the control unit is configured to control the pumping operation of the pumping mechanism based on the measurement result of the negative pressure measuring device.

According to another aspect of the present disclosure, there is provided an exposure method using the proximity exposure device according to above aspect, comprising: loading the mask onto the holder to make the mask be opposite to the substrate to be exposed; suctioning the air in the vacuum hood provided above the mask by the pumping mechanism to form a negative pressure state above the mask; and irradiating the substrate to be exposed with light through the mask to expose the substrate to be exposed.

According to an exemplary embodiment of the present disclosure, loading the mask onto the holder comprises: moving the holder away from the loading table to leave a space for loading the mask above the holder; and loading the mask onto the holder using the space.

According to an exemplary embodiment of the present disclosure, the exposure method using the proximity exposure device further comprises: unloading the mask from the holder after the exposure is finished, comprising: de-vacuuming the sealed space below the vacuum hood; moving the holder away from the loading table to leave a space for unloading the mask above the holder; and unloading the mask from the holder using the space.

According to an exemplary embodiment of the present disclosure, the exposure method using the proximity exposure device further comprises: in the process of exposure, measuring the magnitude of the negative pressure in the vacuum hood and adjusting the negative pressure in the vacuum hood to a target pressure based on the measurement result.

BRIEF DESCRIPTION OF THE DRAWINGS

In order that the objects, features and advantages of the present disclosure will become more apparent, the present disclosure will now be further described below with reference to the accompanying drawings and specific embodiments.

DETAILED DESCRIPTION OF PREFERRED EMBODIMENTS

Figure 1:
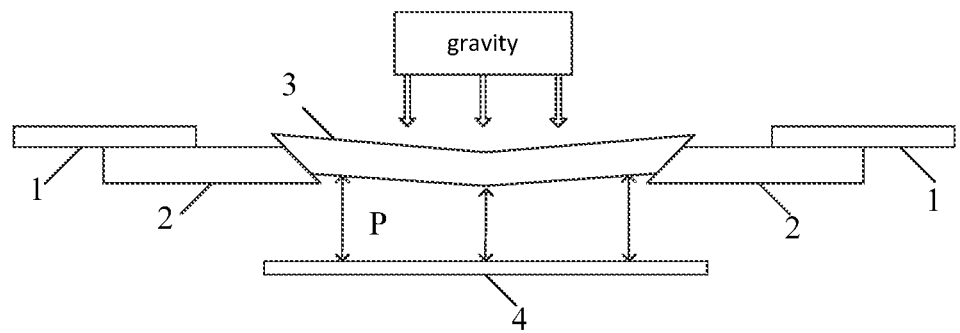
FIG. 1 is a schematic diagram of a proximity exposure device according to an embodiment of the present disclosure.

Hereinafter, embodiments of the present disclosure will be described with reference to the accompanying drawings. However, it is to be understood that such description is exemplary only and is not intended to limit the scope of the disclosure. In addition, in the following description, descriptions of well-known structures and technology are omitted to avoid unnecessarily obscuring the concepts of the present disclosure.

In the drawings, there are shown schematic diagrams of structures according to embodiments of the present disclosure. These figures are not drawn to scale, and for the purpose of clarity, some details are magnified and some details may be omitted. The shapes of the various components shown in the figures and the relative sizes between them are merely exemplary, and those skilled in the art may design components having different shapes and sizes based on the actual requirements.

FIG. 1 is a schematic diagram showing a proximity exposure device according to an embodiment of the present disclosure. As shown in FIG. 1, the proximity exposure device includes a loading table 1 and a holder 2. The holder 2 is mounted on the loading table 1 for holding the mask 3. There is a gap P between the mask 3 and the substrate to be exposed 4. The substrate is irradiated with light, such as a UV beam or beam with other wavelength, through the mask 3 to expose a material layer on the substrate.

According to the embodiment of the present invention, as shown in the schematic diagram of FIG. 1, due to the gravitational effect, the central region of the mask 1 is microscopically deformed to a certain extent, for example, for a mask of size 1200×800, the central region has a depression of about 80 um relative to the surrounding area. Thus, the gap P between the mask 3 and the substrate to be exposed 4 may not be kept uniform.

Figure 2:
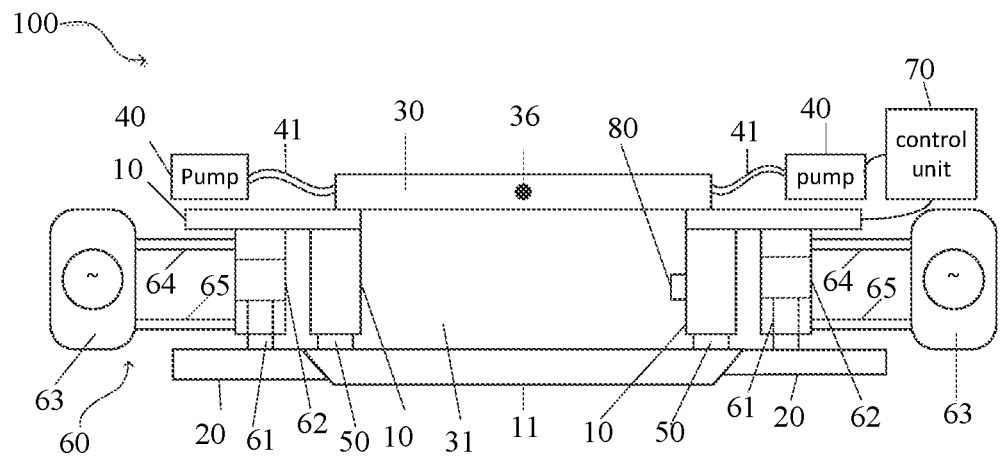
FIG. 2 is a schematic diagram of the structure of a proximity exposure device according to an embodiment of the present disclosure.

FIG. 2 shows a schematic structural view of the proximity exposure device 100 according to an embodiment of the present disclosure. As shown in FIG. 2, the proximity exposure device 100 includes a loading table 10, a holder 20, a vacuum hood 30, and a pumping mechanism 40. The loading table 10 is used to load the mask 11. The holder 20 is mounted to the loading table 10 for holding the mask 11. The holder 20 may, for example, hold the mask in a manner of vacuum suction or mechanical gripping. The vacuum hood 30 is provided above the mask 11 for forming a sealed space 31 above the mask 11. The pumping mechanism 40 is connected to the vacuum hood 30 through a connecting pipe 41 to suck air from the vacuum hood 30 for forming a negative pressure state above the mask 11. The pumping mechanism 40 may be, for example, an air pump. The pumping mechanism 40 may also inject air into the vacuum hood 30.

Figure 3:
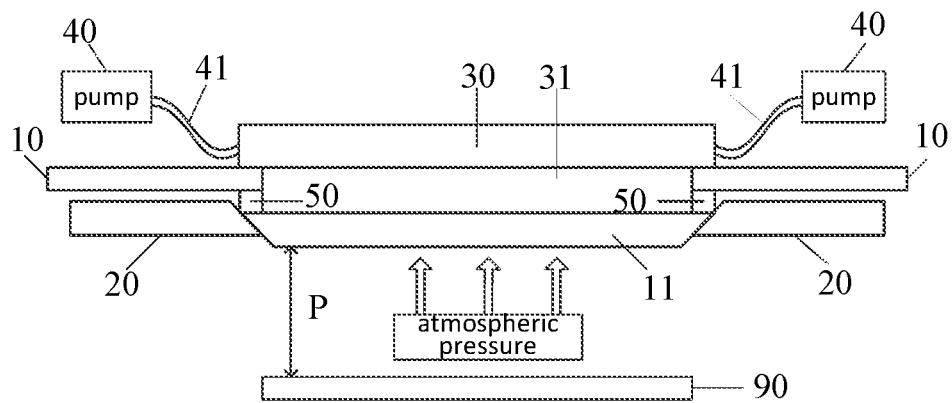
FIG. 3 is a schematic diagram showing the effect of improving the deformation of the mask by the proximity exposure device according to the embodiment shown in FIG. 2.

FIG. 3 shows a schematic view of the effect of improving the deformation of the mask by the proximity exposure device 100 according to the embodiment shown in FIG. 2. As shown in FIG. 3, air is sucked from the vacuum hood 30 by the pumping mechanism 40, and a negative pressure state is created in the sealed space 31 above the mask 11. Thus, the action of the gravity on the mask 11 may be canceled. The mask 11 may be prevented from flexing due to gravity and the mask 11 may be accurately kept in a horizontal state. In other words, the exposure gap P can be kept constant between the mask 11 and the substrate to be exposed 90, and the exposure accuracy of the exposure device is prevented from being decreased due to deformation of the mask 11.

According to this embodiment, the vacuum hood 30, the pumping mechanism 40 and the connecting pipe 41 are all provided outside the loading table 10, thereby it is possible to easily upgrade the conventional proximity exposure device without a significant modification to the loading stage 10.

Further, as shown in FIGS. 2 and 3, a sealing structure 50 is provided below the loading table 10 for sealing the mask 11 under the condition of vacuuming the vacuum hood 30, and thus forming a sealed space 31 above the mask 11. The sealing structure 50 may be, for example, a rubber washer made of a high purity silicone rubber to prevent the internal additives from being precipitated to form particles and thus contaminate the mask. The shape of the rubber washer may be designed according to the shape of the mask. For example, under the condition that the mask 11 is in a rectangular shape, the shape of the rubber washer may be a rectangular annular gasket corresponding to the shape of the periphery of the rectangular mask. The length, width and wireframe thickness of the rubber washer may be appropriately selected depending on the application.

Figure 4:
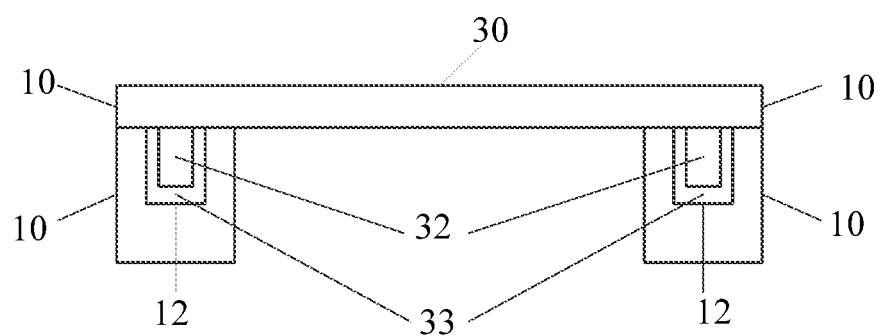
FIG. 4 is a schematic view showing a fixing structure for the vacuum hood and the loading table in FIG. 2.

In the mask exposure device shown in FIG. 2, the vacuum hood 30 is fixed onto the loading table 10. The vacuum hood 30 and the loading table 10 may be connected together by means of vacuum suction or mechanical connection, and remain sealed relative to each other. FIG. 4 shows a schematic view of vacuum hood 30 and the loading table 10 being connected by an exemplary mechanical connection. As shown in FIG. 4, the loading table 10 is provided with a slot 12 and the bottom surface of the vacuum hood 30 is provide with a fixing rod 32. The contact part between the fixing rod 32 and the slot 12 is provided with a rubber pad 33 which contributes to maintain the sealing property. A sealed mechanical connection may be achieved by inserting the fixing rod 32 into the slot 12 on the loading table 10 through the rubber pad 33.

Figure 5:
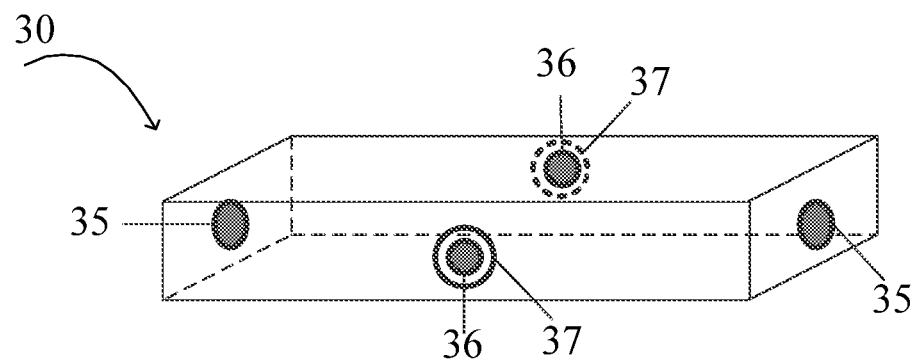
FIG. 5 is a schematic view showing an exemplary structure of the vacuum hood in FIG. 2.

FIG. 5 shows a schematic view of an example structure of the vacuum hood 30 in FIG. 2. As shown in FIG. 5, under the condition that the mask is rectangular, the vacuum hood 30 is of a substantially rectangular bottomless box-like shape as shown in FIG. 5. The bottom of the rectangular box opens toward the mask. Air introduction holes 35 are formed in the side surfaces of the left and right ends of the vacuum hood 30. The air introduction holes 35 may be connected to the pumping mechanism 40 through the connecting pipe 41, respectively, as shown in FIG. 2. It will be appreciated that the number, size and location of the air introduction holes 35 are not limited and may be set according to different applications.

In addition, according to one embodiment of the present disclosure, at least one air introduction hole 36 may be formed in the vacuum hood 30. As shown in FIG. 5, the air introduction holes 36 are provided on the front surface and the rear surface of the vacuum hood 30. It will be understood that the number, size and installation position of the air introduction holes 36 are not limited and may be set according to different applications. The air introduction holes 36 function to introduce the outside air to balance the pressure in the vacuum hood 30 during the evacuation of the vacuum hood 30, so as to prevent the negative pressure inside the vacuum hood from being excessively large, resulting in deformation of the mask in a direction opposite to gravity and then a damage to the mask.

Optionally, a regulating valve 37 may be mounted on the air introduction hole 36 and the flow rate of the outside air flowing into the vacuum hood 30 through the air introduction hole 36 may be adjusted by controlling the opening of the regulating valve 37 so as to balance the negative pressure in the vacuum hood 30, controlling the vacuum degree within the vacuum hood 30 better.

As for the material of the vacuum hood, for example, the high-strength glass (quartz material) may be used, the transmittance of which is more than 95%, and the SiO2 content of which is more than 99.5%. In addition, it has low thermal expansion coefficient, high temperature resistance, good chemical stability, high flatness, and may be transmissive for the ultraviolet light, may guarantee the light passing through directly, the density of which is $2.4\text{-}2.6 \times 10^3$ Kg/m$^3$.

According to some embodiments, for a vacuum hood with a length of 1500 mm-1600 mm, a width of 900 mm-1000 mm, a height of 100 mm-200 mm, and a thickness of 8-10 mm, the diameter of the air outlet hole 35 may be 20 mm-30 mm and the diameter of the air introduction hole 36 may be 10-15 mm.

When the vacuum hood 30 is evacuated, the regulating valve 37 of the air introduction hole 36 is operated to decrease the diameter of the air introduction hole 36, so that the air introduction hole 36 retains an opening of 1.0-1.5 mm. Then, the air pump starts to suck air, the speed of which is maintained at 1.0-1.5 m$^3$/min. When the negative pressure detector shows the pressure within the cavity is in a range of 10 Kpa-15 Kpa, deformation of the mask may be basically disappeared. If the pressure is too large, the sucking speed may be reduced or the diameter of the regulating valve 37 may be increased.

According to an embodiment of the present disclosure, as shown in FIG. 2, the proximity exposure device 100 may further include a drive mechanism 60 for driving the holder 20 to move up and down. Specifically, when the mask 30 is loaded, the drive mechanism 60 may drive the holder 20 to move away from the loading table 10 to form a large space between the holder 20 and the loading table 10 to facilitate loading the mask 11. When the loading of the mask 11 is finished, the drive mechanism 60 may drive the holder 20 to move towards the loading table 10 so that the mask 11 contacts the sealing structure 50 below the loading table 10 and then a sealed space 31 is formed among the loading table 10, the vacuum hood 30 and the mask 11. In this way, the mask may be easily loaded.

Here, the mask 11 may be placed to the exposure position by a manipulator, and then the holder 20 is moved to the exposure position and the mask 11 is loaded onto the holder 20; or the mask 11 may be loaded to the holder 20, and then the holder 20 is moved to the exposure position.

In the above embodiment of the present disclosure, the holder 20 may be moved up and down at a distance, for example, from 0 mm to 500 mm. Thus, it is possible to prevent inconvenience of loading and unloading the mask 11 due to the installation of the vacuum hood 30 on the loading table 10.

Figure 6A:
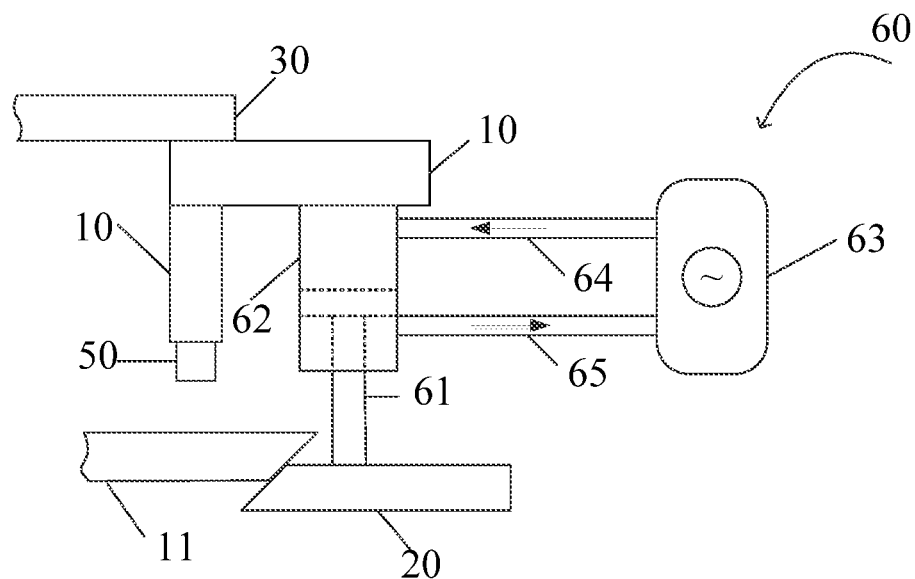
FIGS. 6a and 6b are enlarged views showing the operation process of the hydraulic drive mechanism in FIG. 2.
Figure 6B:
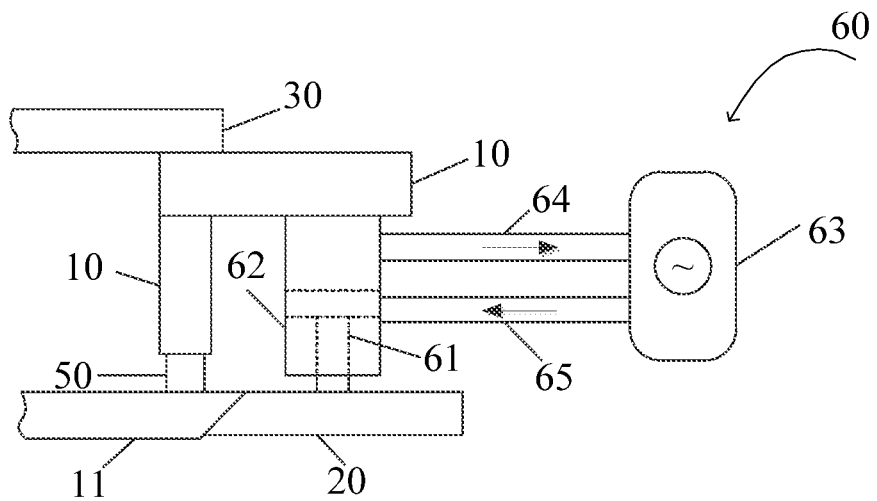

According to an exemplary embodiment, as shown in FIGS. 2 and 6a-6b, the drive mechanism 60 may be a hydraulic drive mechanism including a piston rod 61, a cylinder block 62, and an electrohydraulic servo valve 63. The piston rod 61 is connected to the holder 20 to drive the holder 20 to move up and down. The cylinder block 62 may be fixed to the loading table 10 for receiving the piston rod 61 and the hydraulic oil. The electrohydraulic servo valve 63 is connected to the cylinder block 62 through the first hydraulic oil pipe 64 and the second hydraulic oil pipe 65, and controls the piston rod 61 to move up and down by controlling the hydraulic oil to flow into and out of the cylinder block 62 through the first hydraulic oil pipe 64 and the second hydraulic oil pipe 65.

FIGS. 6a and 6b are enlarged views showing the operation of the hydraulic drive mechanism in FIG. 2. FIG. 6a shows the state in which the drive mechanism 60 drives the holder 20 to move away from the loading table 10, and FIG. 6b shows the state in which the drive mechanism 60 drives the holder 20 to move close to the loading table 10.

Specifically, as shown in FIG. 6a, when the mask 11 is loaded, the electro-hydraulic servo valve 63 controls the upper first hydraulic oil pipe 64 to feed the oil, and the lower second hydraulic oil pipe 65 to discharge the oil. In this way, the piston rod 61 in the hydraulic drive mechanism moves downward and drive the holder 20 to move down until a sufficient space is reserved above the holder 20, so as to maintain hydraulic pressure stable and to place the mask 11 to the exposure position. Thereafter, as shown in FIG. 6b, the electro-hydraulic servo valve 63 controls the feeding and discharging directions of the oil, the upper first hydraulic oil pipe 64 discharges the oil, and the lower second hydraulic oil pipe 65 feeds the oil. In this way, the piston rod 62 moves upwardly, and drives the holder 20 to rise, so that the mask 11 is seated in position and fixed. At this time, the mask 11 is in close contact with the rubber washer 50 below the loading table 10. The hydraulic system is then kept stable, and the mask 11 is held in the exposure position, and ready for exposure.

It will be understood by those skilled in the art that the drive mechanism 60 is not limited to a hydraulic drive mechanism as long as it may drive the holder 20 to move up and down.

In addition, as shown in FIG. 2, the proximity exposure device 100 may further include a control unit 70 for controlling the pumping operation of the pumping mechanism 40 so as to control the magnitude of the negative pressure in the vacuum hood 30. The control unit 70 may include, for example, a computer or other controller. Optionally, the control unit 70 may also control the operation of the drive mechanism 60, for example, by controlling the up and down movement of the piston rod 61 with the electro-hydraulic servo valve 63. Further optionally, the control unit 70 may also control the opening of the regulating valve 37 to control the flow rate of the outside air flowing into the vacuum hood 30 through the air introduction hole 36 to maintain the balanced pressure in the vacuum hood 30 to prevent the mask from being deformed in a direction opposite to gravity.

In order to more precisely control the magnitude of the negative pressure within the vacuum hood 30, according to an embodiment of the present disclosure and as shown in FIG. 2, the proximity exposure device 100 may further include a negative pressure measuring device 80 for measuring the magnitude of negative pressure within the vacuum hood 30, and sends the measurement result to the control unit 70. The negative pressure measuring device 80 is for example, mounted on the inner wall of the loading table 10 in the vacuum hood 30. The control unit 70 controls the pumping operation of the pumping mechanism 40 and/or adjusts the opening of the valve 37 in accordance with the measurement result of the negative pressure measuring device 80. For example, the control unit 70 stores reference negative pressure values corresponding to different types of mask in advance as a target pressure, and compares the negative pressure value transmitted from the negative pressure measuring device 80 with the corresponding reference negative pressure value, and then controls the pumping operation of the pumping mechanism 40 and/or the opening of the valve 37 based on the comparison result, until the negative pressure measured by the negative pressure measuring device 80 is substantially equal to the target pressure.

Under the condition that the installation site of the exposure device is at a standard atmospheric pressure, the reference negative pressure V may be calculated with the following formula:

$$V = 101325 \text{ Pa} - (M_{mask} \times g)/L_{mask} \times W_{mask} \cdots \quad (1)$$

where $M_{mask}$ is the quality of the mask, $L_{mask}$ is the length of the mask, $W_{mask}$ is the width of the mask, and g is the gravitational acceleration of the installation site. The reference negative pressure V represents the vacuum degree required to counteract gravity. It will be understood by those skilled in the art that the above formula (1) may be modified by replacing the above-mentioned standard pressure value 101325 Pa with the actual air pressure under the condition that the exposure device is not installed at a site under a standard atmospheric pressure.

In addition, it is also possible to calibrate the vacuum degree according to different exposure devices, to test the deformation amount and the exposure effect of the specific mask under different vacuum degrees, to find reference negative pressure values suitable for different devices as the target pressure, and the present disclosure is not limited thereto. The mask deformation may be basically eliminated under the condition that it is achieved a suitable vacuum degree within the vacuum hood.

Figure 7:
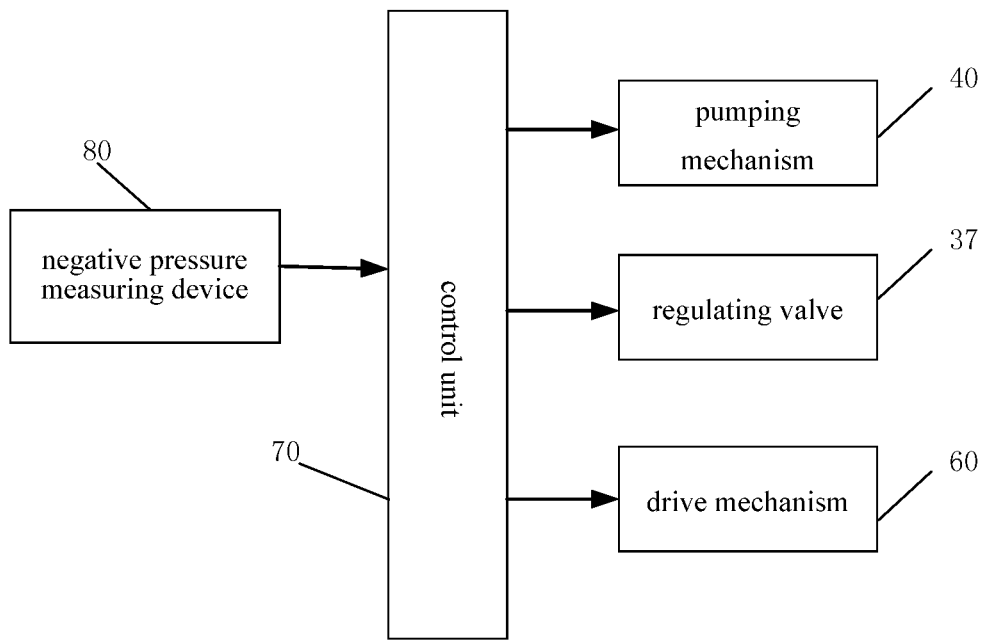
FIG. 7 is a block diagram of a control system of a proximity exposure device as shown in FIG. 2.

FIG. 7 shows a block diagram of a control system according to an example of the proximity exposure device 100 shown in FIG. 2. As shown in FIG. 7, the control system includes a control unit 70, a negative pressure measuring device 80, a pumping mechanism 40, a regulating valve 37 and a drive mechanism 60. The control unit 70 receives the negative pressure measurement result from the negative pressure measuring device 80 and controls the operation of the pumping mechanism 40 and/or the regulating valve 37 in accordance with the negative pressure measurement result. Further, the control unit 70 also controls the drive mechanism 60 to drive the holder 20 to move up and down in accordance with the user input command to load and unload the mask 11. The control unit 70 may be connected to the negative pressure measuring device 80, the pumping mechanism 40, the regulating valve 37 and the drive mechanism 60 in a wired manner, and may be communicated to the negative pressure measuring device 80, the pumping mechanism 40, the regulating valve 37 and the drive mechanism 60 in a wireless manner to achieve control.

Figure 8:
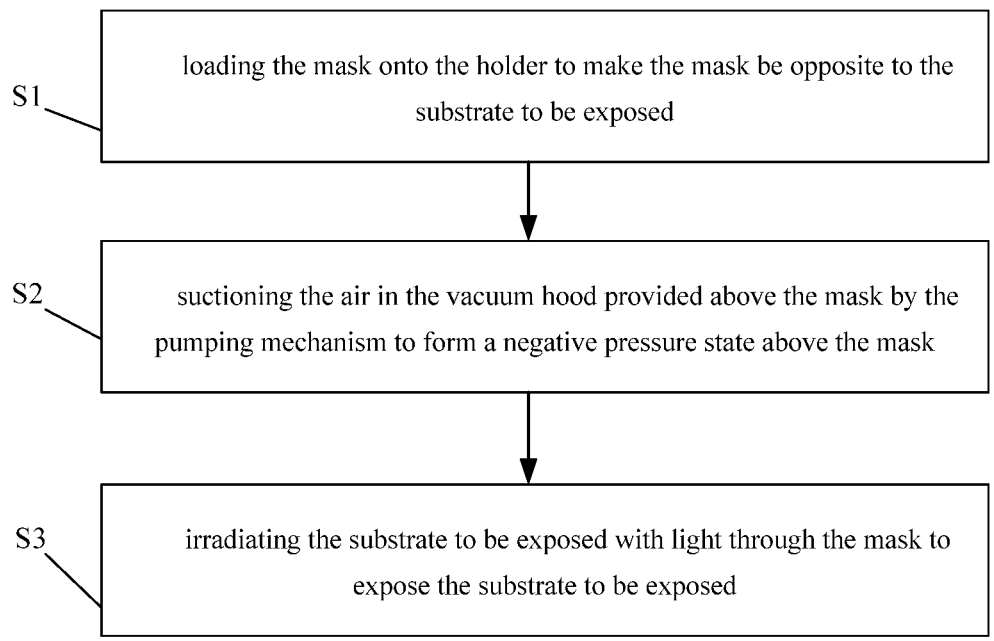
FIG. 8 shows a flow chart of the exposure process of the proximity exposure device as shown in FIG. 2.
Figure 8A:
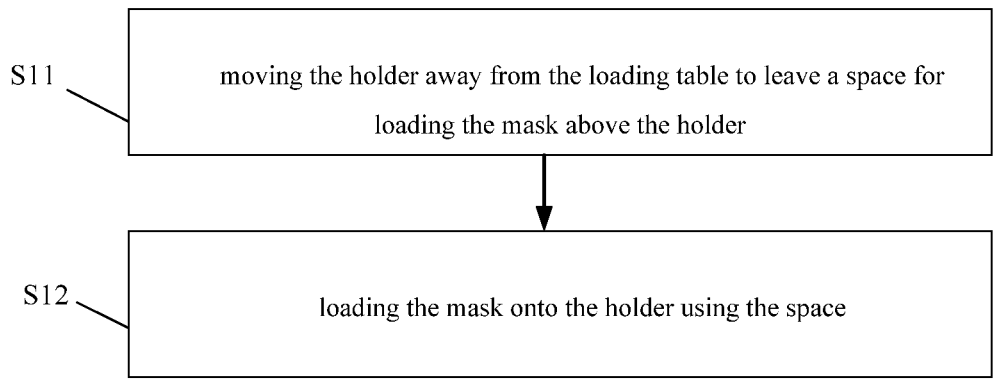
FIG. 8a shows a flow chart of the process of loading a mask.

The exposure process of the proximity exposure device 100 shown in FIG. 2 will be described below. FIG. 8 shows a flow chart of the exposure process of the proximity exposure device as shown in FIG. 2. FIG. 8*a* shows a flow chart of the process of loading a mask; and FIG. 8*b* shows a flow chart of the process of unloading a mask.

As shown in FIGS. 2 and 8, the exposure process includes: firstly loading the mask 11 onto the holder 20 to make the mask 11 be opposite to the substrate to be exposed (S1). At this time, as shown in FIG. 3, a sealed space 31 is formed among the loading table 10, the vacuum hood 30 and the mask 11. Then, a step of sucking the air in the vacuum hood 30 by the pumping mechanism 40 to form a negative pressure state (S2) above the mask 11 is performed. Then, a step of irradiating the exposure light onto the substrate to be exposed through the mask 11 to expose the substrate (S3) is performed. During the exposure, the negative pressure state of the vacuum hood 30 is maintained. Therefore, since the negative pressure state is formed in the vacuum hood 30 by the pumping mechanism 40, the action of the gravity on the mask 11 is canceled, preventing the mask 11 from flexing due to the gravitational force, so that the mask 11 is always kept in a horizontal state. It allows the gap between the mask and the substrate to be exposed to remain constant, thus ensuring the exposure accuracy of the exposure device.

According to one embodiment, as shown in FIGS. 2 and 8*a*, loading the mask 11 onto the holder 20 comprises firstly driving the holder 20 to move away from the loading table 10, for example move downwards at a distance of 200-220 mm, under action of the hydraulic drive mechanism 60, to leave a space required for loading a mask over the holder 20 (S11). Then, a step of loading the mask 11 onto the holder 20 through the space (S12) is performed. Specifically, the mask 11 may be firstly placed at the exposure position for being exposed, for example, the mask may be conveyed to the exposure position by a manipulator, and then the holder 20 is moved toward the loading table 10 to the exposure position and the mask 11 is loaded for being exposed; or the mask 11 may be loaded onto the holder 20 firstly, and then the holder 20 is moved toward the loading table 10 to the exposure position for being exposed. Thereby, the inconvenience of loading a mask 11 because the vacuum hood 30 is mounted on the loading table 10 can be prevented.

Figure 8B:
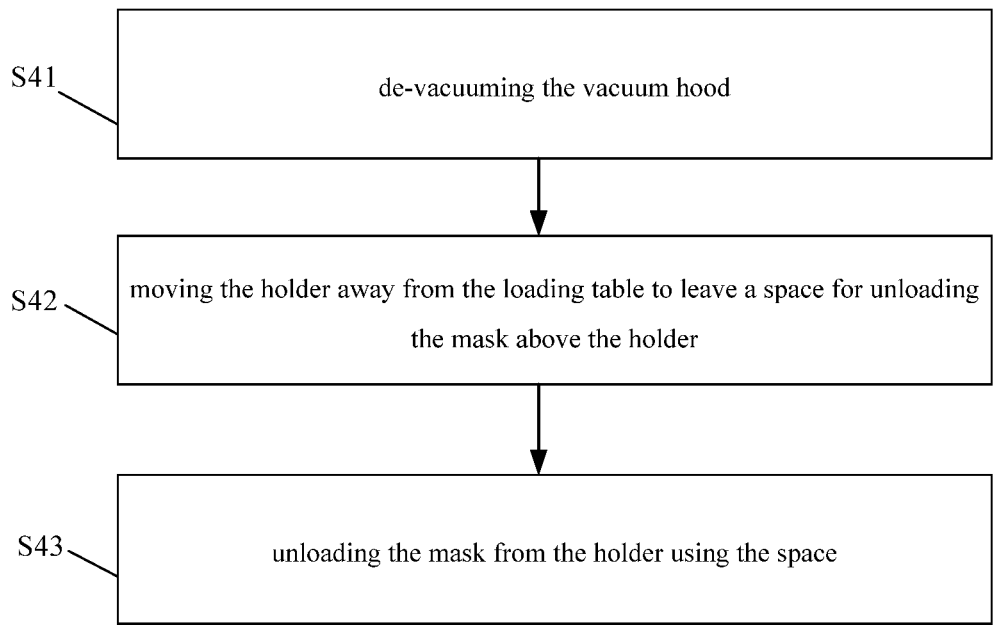
FIG. 8b shows a flow chart of the process of unloading a mask.

Similarly, as shown in FIGS. 2 and 8*b*, unloading the mask 11 from the holder 20 after the exposure is finished includes: firstly gradually removing the negative pressure state of the vacuum hood 30. For example, the suction rate of the pumping mechanism 40 is reduced until the pumping mechanism 40 is closed. Alternatively, the opening of the regulating valve 37 of the air introduction hole 36 is increased, and the outside air is introduced into the vacuum hood 30 to de-vacuum the vacuum hood (S41). Then, the holder 20 is moved away from the loading table 10. For example, the holder 20 is moved downward at a distance of 200-220 mm by the drive mechanism 40 to leave a sufficient space to unload the mask 11 over the holder (S42). Then, a step of unloading the mask from the holder 20 through this space (S43) is performed. For example, the mask 11 is removed from the holder 20 by a manipulator. Thus, the inconvenience of unloading a mask 11 because the vacuum hood 30 is mounted on the loading table 10 can be prevented.

Optionally, during the exposure, the magnitude of the negative pressure in the vacuum hood 30 may be measured, and the pumping operation of the pumping mechanism 40 or the opening of the regulating valve 37 may be controlled by the control unit 70 in accordance with the measurement result so as to maintain a constant negative pressure within the vacuum hood 30. This eliminates the bending effect of gravity on the center of the mask, keeping the exposure gap being consistent, thus ensuring a better exposure accuracy of the exposure device.

As described above, according to the proximity exposure device of the embodiments of the present disclosure, the influence of the gravity on the mask is eliminated by vacuum pumping method with a vacuum hood above the loading table. At the same time, an air introduction hole and an air outlet hole are formed on the vacuum hood. When the mask is exposed, the vacuum hood is evacuated through the air outlet hole, and the outside air is appropriately introduced through the air introduction hole, thereby maintaining the balance of the vacuum degree in the vacuum hoop. This may remove the impact of gravity, while preventing the negative pressure being too large in the vacuum hood to ensure that the mask does not deform, so as to maintain uniform exposure gap to ensure the exposure accuracy of the exposure device. It may also effectively reduce the risk of the mask being scratched during the low gap exposure.

In addition, by improving the operation of the holder drive mechanism, the holder is moved downwardly during loading and unloading of the mask, a sufficient space is reserved above the holder for loading and unloading the mask so that the process of loading and unloading the mask is much easier.

Further, the proximity exposure device of the embodiment of the present disclosure is able to precisely control the magnitude of the negative pressure in the vacuum hood, effectively solving the problem of the deformation of the mask due to gravity, and it is not necessary to manufacture corresponding masks according to different exposure devices, reducing the cost for manufacturing the masks.

In addition, according to the proximity exposure device of the present embodiment, the vacuum hood, the pumping mechanism and the connecting pipe are provided outside the loading table, and it is possible to easily upgrade the existing exposure device without a substantial modification to the loading table.

The foregoing embodiments illustrate, by way of example only, the principles and constructions of the present disclosure and are not intended to be limiting to the present disclosure, and those skilled in the art will appreciate that any modifications and improvements made to the present disclosure without departing from the general idea of the present disclosure are within the scope of this disclosure. The scope of the present disclosure is intended to be within the scope of the present invention as defined by the appended claims.

What is claimed is:

1. A proximity exposure device comprising:
   a loading table;
   a holder mounted onto the loading table to hold a mask;
   a vacuum hood arranged above the mask to form a sealed space above the mask; and
   a pumping mechanism connected to the vacuum hood to pump air from the vacuum hood, such that a negative pressure state is formed above the mask;
   wherein the vacuum hood comprises at least one air introduction hole for introducing outside air into the vacuum hood, and
   wherein the air introduction hole is provided with a regulating valve configured to adjust the flow rate of the outside air flowing through the air introduction hole.

2. The proximity exposure device according to claim 1, wherein the vacuum hood is fixed on the loading table.

3. The proximity exposure device according to claim 1, wherein a sealing structure is provided below the loading table for forming a sealed state between the loading table and the mask.

4. The proximity exposure device according to claim 1, wherein the proximity exposure device further comprises a drive mechanism for driving the holder to move up and down.

5. The proximity exposure device according to claim 4, wherein the drive mechanism is a hydraulic drive mechanism, comprising:
   a piston rod connected to the holder to drive the holder to move up and down;
   a cylinder block for accommodating the piston rod and hydraulic oil; and
   an electro-hydraulic servo valve connected to the cylinder block through a first hydraulic oil pipe and a second hydraulic oil pipe so as to control the piston rod to move up and down by controlling the hydraulic oil to flow into and out of the cylinder block through the first hydraulic oil pipe and the second hydraulic oil pipe.

6. The proximity exposure device according to claim 4, wherein the proximity exposure device further comprises a control unit for controlling an operation of the drive mechanism.

7. The proximity exposure device according to claim 1, wherein the proximity exposure device further comprises a control unit for controlling a pumping operation of the pumping mechanism.

8. The proximity exposure device according to claim 7, wherein the proximity exposure device further comprises a negative pressure measuring device for measuring a magnitude of the negative pressure in the vacuum hood and transmitting a measurement result to the control unit; and
   the control unit is configured to control the pumping operation of the pumping mechanism based on the measurement result of the negative pressure measuring device.

9. The proximity exposure device according to claim 1, wherein the proximity exposure device further comprises a control unit for controlling opening of the regulating valve.

10. An exposure method using the proximity exposure device according to claim 1, comprising:
    loading the mask onto the holder to make the mask be opposite to the substrate to be exposed;
    suctioning the air in the vacuum hood provided above the mask by the pumping mechanism to form a negative pressure state above the mask; and
    irradiating the substrate to be exposed with light through the mask to expose the substrate to be exposed,
    wherein loading the mask onto the holder comprises:
      moving the holder away from the loading table to leave a space for loading the mask above the holder; and
      loading the mask onto the holder using the space.

11. The exposure method according to claim 10, further comprising:
    unloading the mask from the holder after the exposure is finished, comprising:

de-vacuuming the sealed space below the vacuum hood;
moving the holder away from the loading table to leave a space for unloading the mask above the holder; and
unloading the mask from the holder using the space.

12. The exposure method according to claim 10, further comprising:
in the process of exposure, measuring the magnitude of the negative pressure in the vacuum hood and adjusting the negative pressure in the vacuum hood to a target pressure based on the measurement result.

* * * * *